(12) United States Patent
Lee

(10) Patent No.: US 9,450,574 B2
(45) Date of Patent: Sep. 20, 2016

(54) SEMICONDUCTOR DEVICE AND SEMICONDUCTOR SYSTEM INCLUDING THE SAME

(71) Applicant: SK hynix Inc., Incheon-si Gyeonggi-do (KR)

(72) Inventor: Sang Hoon Lee, Seoul (KR)

(73) Assignee: SK hynix Inc., Icheon-si, Gyeonggi-do (KR)

(*) Notice: Subject to any disclaimer, the term of this patent is extended or adjusted under 35 U.S.C. 154(b) by 0 days.

(21) Appl. No.: 14/526,631

(22) Filed: Oct. 29, 2014

(65) Prior Publication Data

US 2016/0065181 A1    Mar. 3, 2016

(30) Foreign Application Priority Data

Aug. 28, 2014 (KR) .................. 10-2014-0113492

(51) Int. Cl.
| | |
|---|---|
| *H03L 5/00* | (2006.01) |
| *H03K 5/24* | (2006.01) |
| *H03K 5/003* | (2006.01) |
| *G11C 7/04* | (2006.01) |
| *H03K 19/003* | (2006.01) |

(52) U.S. Cl.
CPC . *H03K 5/24* (2013.01); *G11C 7/04* (2013.01); *H03K 5/003* (2013.01); *H03K 19/00369* (2013.01)

(58) Field of Classification Search
CPC ...... H03F 3/195; H03F 3/245; H03F 1/0227; H03F 1/0277
See application file for complete search history.

(56) References Cited

U.S. PATENT DOCUMENTS

| | | | |
|---|---|---|---|
| 2007/0126471 A1* | 6/2007 | Jeong | G11C 5/147 326/30 |
| 2013/0242674 A1 | 9/2013 | Furutani et al. | |
| 2016/0040913 A1* | 2/2016 | Bruckman | F25B 9/14 62/6 |

FOREIGN PATENT DOCUMENTS

KR    100691374 B1    2/2007

* cited by examiner

*Primary Examiner* — Sibin Chen
(74) *Attorney, Agent, or Firm* — William Park & Associates Ltd.

(57) ABSTRACT

A semiconductor system includes a first semiconductor device including an offset signal generation circuit configured to compare at least one sensing code and a temperature code and generate an input offset signal, and a second semiconductor device including a temperature code generation circuit configured to be inputted with the input offset signal, compare a reference voltage controlled according to the input offset signal and a temperature signal, and generate the temperature code.

18 Claims, 12 Drawing Sheets

FIG.9

| OFFSET_OUT<3> | OFFSET_OUT<2> | OFFSET_OUT<1> | DEC<3> | DEC<2> | DEC<1> |
|---|---|---|---|---|---|
| L | L | L | L | L | H |
| L | L | H | L | H | L |
| L | H | L | H | L | L |

FIG.11

| DEC<3> | DEC<2> | DEC<1> | TCODE<3> | TCODE<2> | TCODE<1> |
|--------|--------|--------|----------|----------|----------|
| L      | L      | H      | L        | H        | H        |
| L      | H      | L      | L        | H        | H        |
| H      | L      | L      | H        | H        | H        |

US 9,450,574 B2

SEMICONDUCTOR DEVICE AND SEMICONDUCTOR SYSTEM INCLUDING THE SAME

CROSS-REFERENCE TO RELATED APPLICATION

The present application claims priority under 35 U.S.C. §119(a) to Korean application number 10-2014-0113492, filed on Aug. 28, 2014, in the Korean Intellectual Property Office, which is incorporated herein by reference in its entirety.

BACKGROUND

1. Technical Field

Embodiments of the disclosure relate to a semiconductor device and a semiconductor system including the same.

2. Related Art

Packaging technologies for putting a high capacity memory and a controller in the same package include an SiP (System in Package) packaging technology and a CoC (Chip on Chip) packaging technology. The SiP packaging technology adopts a scheme that chips are electrically coupled through wire bonding. The CoC packaging technology is most advantageous in realizing the high integration of a memory and a high speed operation between a memory and a controller. This is because the memory and the controller transmit signals including data to each other through micro bump pads.

Since the diameter of a micro bump pad is only several tens of micrometers, properties such as resistance, inductance and parasitic capacitance are low, and thus, it is easy to increase an operation frequency. Therefore, the transmission speed of data may be easily improved by a method of increasing the number of micro bump pads. In the CoC packaging technology, micro bump pads are formed on the memory and the controller. As the micro bump pads formed on the memory and the controller are electrically coupled with each other, the memory and the controller are formed as one chip.

A semiconductor device includes a plurality of memory cells each of which is configured by one transistor and one storage capacitor. The data retention characteristic of a memory cell sensitively changes according to even a temperature. Therefore, it may be necessary to regulate the operating condition of circuit blocks in a semiconductor system, according to a change in the internal temperature of a semiconductor device. In regulating an operating condition according to a change in the internal temperature of a semiconductor system, a temperature sensor such as a digital temperature sensor regulator (DTSR), an analog temperature sensor regulator (ATSR) or a digital temperature compensated self-refresh (DTCSR) is used.

SUMMARY

In an embodiment, a semiconductor system may include a first semiconductor device including an offset signal generation circuit configured to compare at least one sensing code and a temperature code and generate an input offset signal. The semiconductor system may also include a second semiconductor device including a temperature code generation circuit configured to be inputted with the input offset signal, compare a reference voltage controlled according to the input offset signal and a temperature signal, and generate the temperature code.

In an embodiment, a semiconductor device may include a reference voltage generation block configured to generate a reference voltage controlled according to a level combination of an input offset signal. The semiconductor device may also include a comparison block configured to compare the reference voltage and a temperature signal of which level is set according to an internal temperature of a semiconductor device, and to generate a temperature code. Further, the input offset signal is generated as a controller electrically coupled with the semiconductor device through at least one pad compares at least one sensing code and the temperature code.

In an embodiment, a semiconductor system may include a first semiconductor device including a first temperature sensor configured to sense an internal temperature of a left region and to generate first sensing codes, a second temperature sensor configured to sense an internal temperature of a center region and to generate second sensing codes, and a third temperature sensor configured to sense an internal temperature of a right region and to generate third sensing codes. The semiconductor system may also include a second semiconductor device configured to control levels of reference voltages according to a logic combination of first and second input offset signals, to generate a temperature signal, to compare the levels of the reference voltages and the temperature signal, and to generate temperature codes

BRIEF DESCRIPTION OF THE DRAWINGS

FIGS. 8 to 11 are representations of examples of diagrams to assist in the explanation of operations of the semiconductor system in accordance with an embodiment.

DETAILED DESCRIPTION

Hereinafter, a semiconductor device and a semiconductor system including the same will be described below with reference to the accompanying drawings through various embodiments. Various embodiments are directed to a semiconductor device and a semiconductor system including the same, capable of performing temperature compensation according to an internal temperature difference between semiconductor devices.

Figure 1:
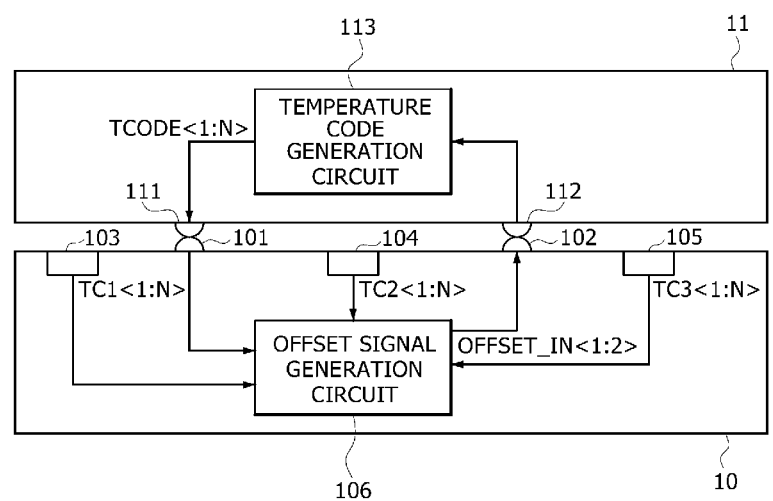
FIG. 1 is a block diagram illustrating a representation of an example of the configuration of a semiconductor system in accordance with an embodiment.

Referring to FIG. 1, a semiconductor system in accordance with an embodiment includes a first semiconductor device 10 and a second semiconductor device 11. The first semiconductor device 10 includes a first pad 101, a second pad 102, a first temperature sensor 103, a second temperature sensor 104, a third temperature sensor 105, and an offset signal generation circuit 106. The second semiconductor device 11 includes a third pad 111, a fourth pad 112, and a temperature code generation circuit 113. The first pad 101 and the third pad 111 are electrically coupled. In addition, transfer temperature codes TCODE<1:N> generated in the temperature code generation circuit 113 reach the first semiconductor device 10. The second pad 102 and the fourth pad 112 are electrically coupled and transfer first and second input offset signals OFFSET_IN<1:2> generated in the offset signal generation circuit 106 reach to the second semiconductor device 11. The first semiconductor device 10 may be realized as a controller to control the operation of the second semiconductor device 11. While input offset signals are realized as 2-bit signals in the embodiment, it is to be noted that input offset signals may be realized as multi-bit signals according to an embodiment.

The first temperature sensor 103 senses the internal temperature of the left region of the first semiconductor device 10. The first temperature sensor 103 also generates first sensing codes TC1<1:N>. The second temperature sensor 104 senses the internal temperature of the center region of the first semiconductor device 10.

The second temperature sensor 104 also generates second sensing codes TC2<1:N>. The third temperature sensor 105 senses the internal temperature of the right region of the first semiconductor device 10. The third temperature sensor 105 also generates third sensing codes TC3<1:N>. The positions of the first temperature sensor 103, the second temperature sensor 104 and the third temperature sensor 105 may be set variously according to embodiments. Further, the number of the temperature sensors included in the first semiconductor device 10 and the number of the bits included in sensing codes may be set variously according to various embodiments.

The offset signal generation circuit 106 is inputted with the first sensing codes TC1<1:N>, the second sensing codes TC2<1:N> and the third sensing codes TC3<1:N> from the first temperature sensor 103, the second temperature sensor 104 and the third temperature sensor 105. The offset signal generation circuit 106 is inputted with the temperature codes TCODE<1:N> through the first pad 101. The offset signal generation circuit 106 compares the internal temperature of the first semiconductor device 10 sensed from the first sensing codes TC1<1:N>, the second sensing codes TC2<1:N> and the third sensing codes TC3<1:N> and the internal temperature of the second semiconductor device 11 sensed from the temperature codes TCODE<1:N>. The offset signal generation circuit 106 also generates the first and second input offset signals OFFSET_IN<1:2>. The offset signal generation circuit 106 transfers the first and second input offset signals OFFSET_IN<1:2> to the second semiconductor device 11 through the second pad 102. The number N of the bits of the first sensing codes TC1<1:N>, the second sensing codes TC2<1:N> and the third sensing codes TC3<1:N> may be set variously according to various embodiments.

The temperature code generation circuit 113 is inputted with the first and second input offset signals OFFSET_IN<1:2> through the fourth pad 112. The temperature code generation circuit 113 also performs a temperature compensating operation by the first and second input offset signals OFFSET_IN<1:2> and generates the temperature codes TCODE<1:N>. The temperature code generation circuit 113 outputs the temperature codes TCODE<1:N> through the third pad 111. Detailed descriptions for the configuration and the temperature compensating operation of the temperature code generation circuit 113 will be made below with reference to FIGS. 2 to 11.

Figure 2:
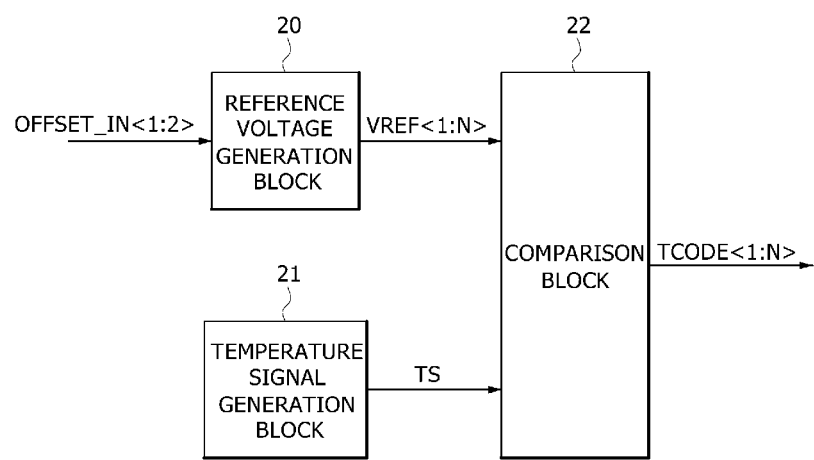
FIG. 2 is a block diagram illustrating a representation of an example of the configuration of the temperature code generation circuit included in the semiconductor system shown in FIG. 1.

Referring to FIG. 2, the temperature code generation circuit 113 includes a reference voltage generation block 20, a temperature signal generation block 21, and a comparison block 22. The reference voltage generation block 20 controls the levels of reference voltages VREF<1:N> according to the logic combination of the first and second input offset signals OFFSET_IN<1:2>. The temperature signal generation block 21 senses the internal temperature of the second semiconductor device 11. The temperature signal generation block 21 also generates a temperature signal TS which has a level corresponding to the internal temperature. The comparison block 22 compares the levels of the reference voltages VREF<1:N> and the temperature signal TS. The comparison block 22 also generates the temperature codes TCODE<1:N>. For example, in the state in which the reference voltage VREF<1> has a level corresponding to 80 and the reference voltage VREF<2> has a level corresponding to 90, in the case where the temperature signal TS has a level higher than the level of the reference voltage VREF<1> and lower than the level of the reference voltage VREF<2>, the temperature code TCODE<1> and the temperature code TCODE<2> may be set to be generated to a logic high level and a logic low level, respectively. By such a level combination of the temperature codes TCODE<1:2>, that is, 'logic high level, logic low level' (hereinafter, expressed as 'H,L'), it may be checked that the internal temperature of the second semiconductor device 11 is between 80 and 90. The respective levels and the number N of the bits included in the reference voltages VREF<1:N> may be set variously according to embodiments. The respective levels and the number N of the bits included in the temperature codes TCODE<1:N> may be set variously according to various embodiments.

Figure 3:
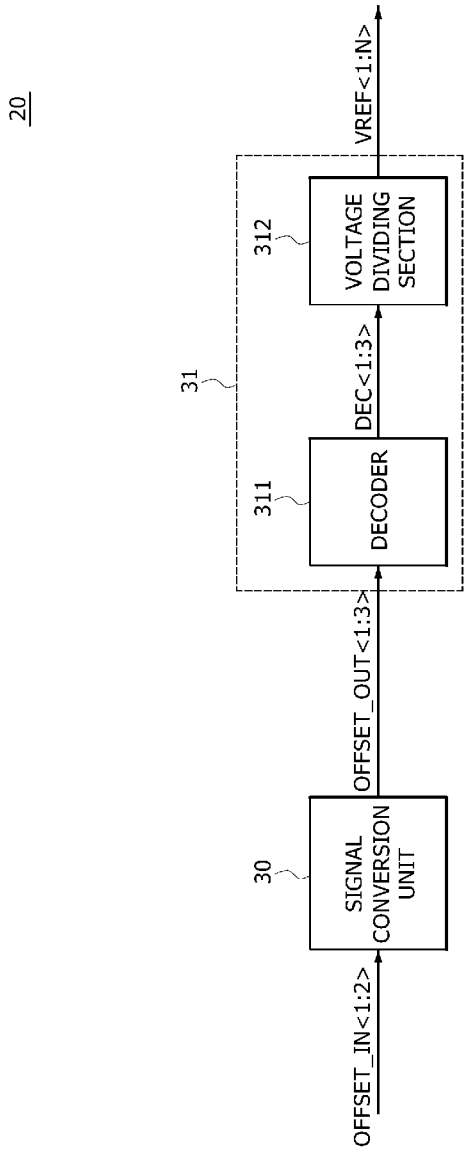
FIG. 3 is a block diagram illustrating a representation of an example of the configuration of the reference voltage generation block included in the temperature code generation circuit shown in FIG. 2.

Referring to FIG. 3, the reference voltage generation block 20 includes a signal conversion unit 30 and a reference voltage output unit 31. The reference voltage output unit 31 includes a decoder 311 and a voltage dividing section 312. The signal conversion unit 30 converts the first and second input offset signals OFFSET_IN<1:2>. The signal conversion unit 30 also generates first to third output offset signals OFFSET_OUT<1:3>. In detail, the signal conversion unit 30 retains or increases by 1 bit the level combination of the first to third output offset signals OFFSET_OUT<1:3> according to the level combination of the first and second input offset signals OFFSET_IN<1:2>. The decoder 311 generates first to third decoding signals DEC<1:3> which are selectively enabled according to the level combination of the first to third output offset signals OFFSET_OUT<1:3>. The voltage dividing section 312 controls the levels of the reference voltages VREF<1:N> according to the level combination of the first to third decoding signals DEC<1:3>.

Figure 4:
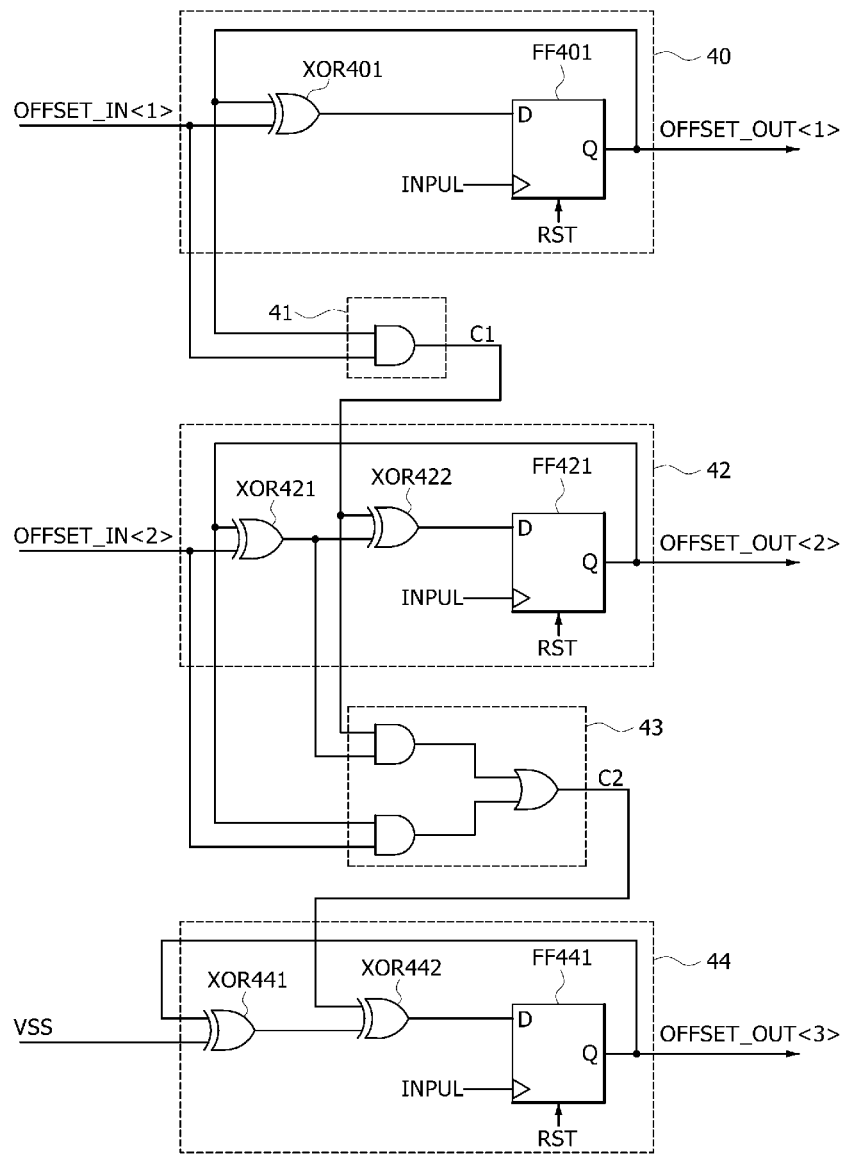
FIG. 4 is a circuit diagram illustrating a representation of an example of the configuration of the signal conversion unit included in the reference voltage generation block shown in FIG. 3.

Referring to FIG. 4, the signal conversion unit 30 includes a first output control section 40, a first carry section 41, a second output control section 42, a second carry section 43, and a third output control section 44. The first output control section 40 includes an exclusive OR element XOR401 and a D flip-flop FF401. The first carry section 41 is inputted with and ANDs the first input offset signal OFFEST_IN<1> and the first output offset signal OFFSET_OUT<1>. The first carry section 41 also generates a first carry signal C1. The second output control section 42 includes exclusive OR elements XOR421 and XOR422, and a D flip-flop FF421. The second carry section 43 is inputted with the first carry signal C1, the output signal of the exclusive OR element XOR421, the second input offset signal OFFEST_IN<2> and the second output offset signal OFFSET_OUT<2>. The second carry section 43 also generates a second carry signal C2. The third output control section 44 includes exclusive OR elements XOR441 and XOR442, and a D flip-flop FF441. The D flip-flops FF401, FF421 and FF441 initialize all the first to third output offset signals OFFSET_OUT<1: 3> to a logic low level when a reset signal RST of a logic high level is inputted. The D flip-flops FF401, FF421 and FF441 respectively output input signals, as the first to third output offset signals OFFSET_OUT<1:3>, in synchronization with an input pulse INPUL. According to an embodiment, the reset signal RST and the input pulse INPUL may be realized to be generated inside or outside the second semiconductor device 11. In the alternative, the reset signal RST and the input pulse INPUL may be realized to be applied from the first semiconductor device 10.

The signal conversion unit 30 retains or increases by 1 bit the level combination of the first to third output offset signals OFFSET_OUT<1:3> according to the level combination of the first and second input offset signals OFFSET_IN<1:2> each time the input pulse INPUL is inputted. For example, where the first and second input offset signals OFFSET_IN<1:2> have the level combination of 'L,L' in synchronization with the input pulse INPUL, the level combination of the first to third output offset signals OFFSET_OUT<1:3> is retained. Further, where the first and second input offset signals OFFSET_IN<1:2> have the level combination of 'H,L' in synchronization with the input pulse INPUL, the level combination of the first to third output offset signals OFFSET_OUT<1:3> is increased by 1 bit. The case where the first and second input offset signals OFFSET_IN<1:2> have the level combination of 'H,L' means that the first input offset signal OFFEST_IN<1> has a logic high level and the second input offset signal OFFEST_IN<2> has a logic low level. Where the level combination of the first to third output offset signals OFFSET_OUT<1:3> is increased by 1 bit, the level combination of the first to third output offset signals OFFSET_OUT<1:3> is sequentially changed in the order of 'L,L,L', 'H,L,L', 'L,H,L', 'H,H,L', 'L,L,H', 'H,L,H', 'L,H, H', 'H,H,H' and 'L,L,L'.

Figure 5:
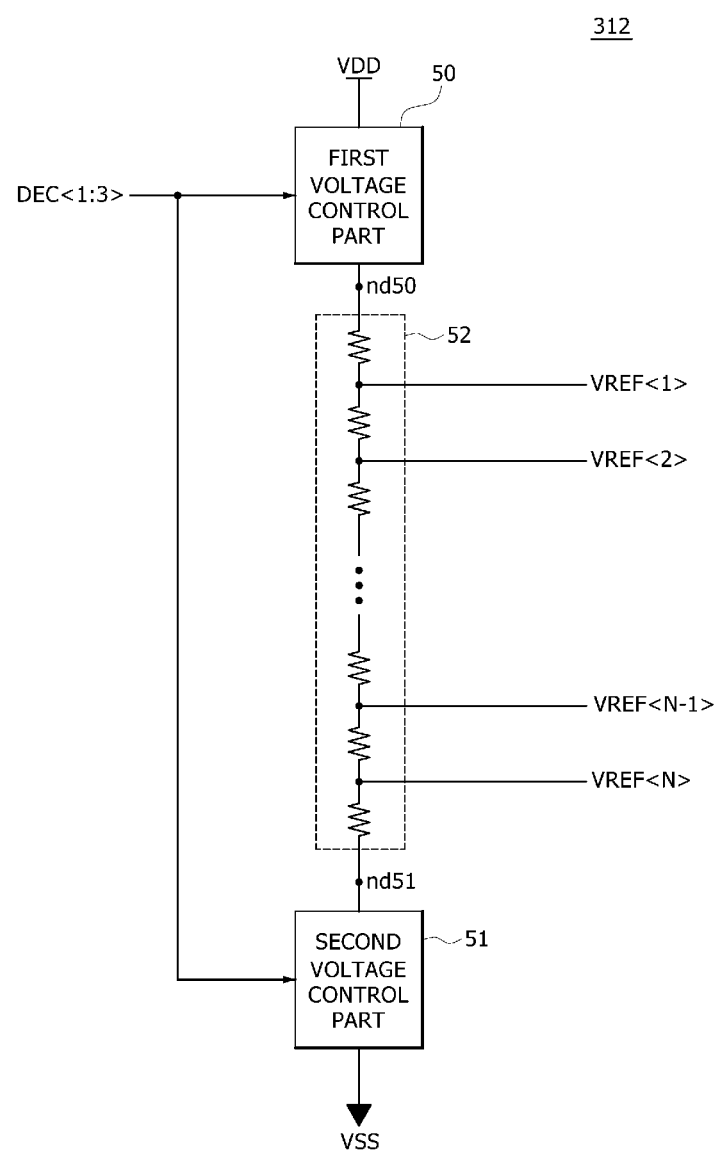
FIG. 5 is a circuit diagram illustrating a representation of an example of the voltage dividing section included in the reference voltage generation block shown in FIG. 3.

Referring to FIG. 5, the voltage dividing section 312 includes a first voltage control part 50, a second voltage control part 51, and a resistor part 52. The first voltage control part 50 controls the resistance value between a power supply voltage VDD and a node nd50 in response to the first to third decoding signals DEC<1:3>. The second voltage control part 51 controls the resistance value between a node nd51 and a ground voltage VSS in response to the first to third decoding signals DEC<1:3>. The resistor part 52 includes a plurality of resistor elements electrically coupled between the node nd50 and the node nd51. The resistor part 52 also generates the reference voltages VREF<1:N> through voltage division. The voltage dividing section 312 generates the reference voltages VREF<1:N> which have lower levels as the resistance value of the first voltage control part 50 increases and the resistance value of the second voltage control part 51 decreases. Conversely, the voltage dividing section 312 generates the reference voltages VREF<LN> which have higher levels as the resistance value of the first voltage control part 50 decreases and the resistance value of the second voltage control part 51 increases. The numbers of bits included in the decoding signals DEC<1:3> and the reference voltages VREF<1:N> may be set variously according to various embodiments.

Figure 6:
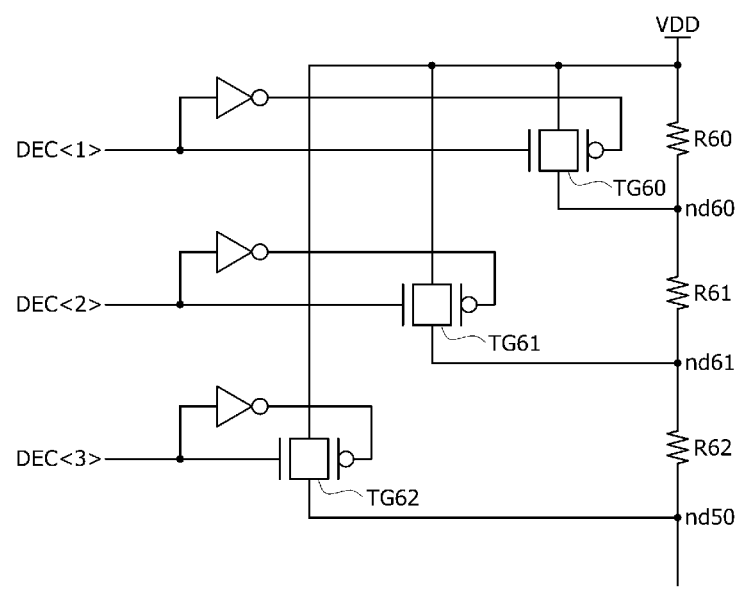
FIG. 6 is a circuit diagram illustrating a representation of an example of the first voltage control part included in the voltage dividing section shown in FIG. 5.

Referring to FIG. 6, the first voltage control part 50 includes resistor elements R60, R61 and R62 and transfer gates TG60, TG61 and TG62. The resistor element R60 is electrically coupled between the power supply voltage VDD and a node nd60. The resistor element R61 is electrically coupled between the node nd60 and a node nd61. The resistor element R62 is electrically coupled between the node nd61 and the node nd50. The transfer gate TG60 is turned on when the first decoding signal DEC<1> is set to a logic high level. In addition, the transfer gate TG60 electrically couples the power supply voltage VDD and the node nd60. The transfer gate TG61 is turned on when the second decoding signal DEC<2> is set to a logic high level. Further, the transfer gate TG61 electrically couples the power supply voltage VDD and the node nd61. The transfer gate TG62 is turned on when the third decoding signal DEC<3> is set to a logic high level. Moreover, the transfer gate TG62 electrically couples the power supply voltage VDD and the node nd50. The first voltage control part 50 is set to have a highest resistance value when the first decoding signal DEC<1> is enabled to the logic high level. The first voltage control part 50 is also set to have a lowest resistance value when the third decoding signal DEC<3> is enabled to the logic high level.

Figure 7:
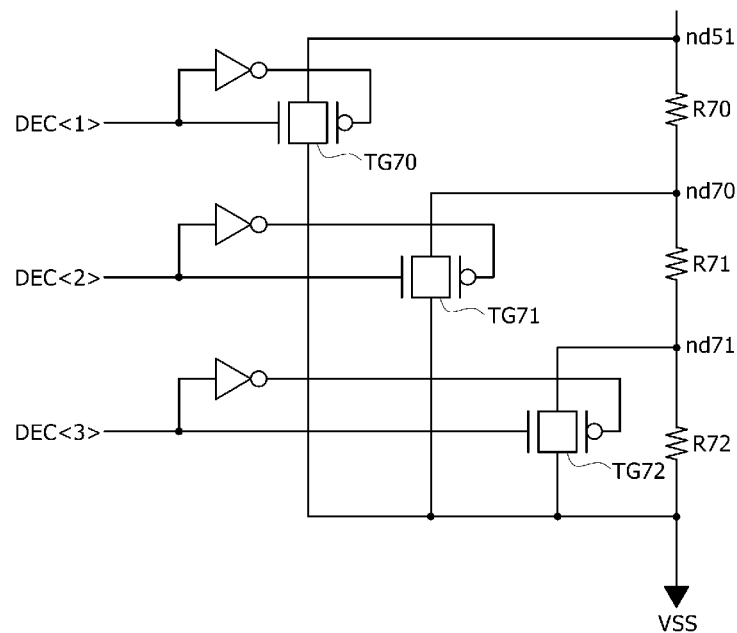
FIG. 7 is a circuit diagram illustrating a representation of an example of the second voltage control part included in the voltage dividing section shown in FIG. 5.

Referring to FIG. 7, the second voltage control part 51 includes resistor elements R70, R71 and R72 and transfer gates TG70, TG71 and TG72. The resistor element R70 is electrically coupled between the node nd51 and a node nd70. The resistor element R71 is electrically coupled between the node nd70 and a node nd71. The resistor element R72 is electrically coupled between the node nd71 and the ground voltage VSS. The transfer gate TG70 is turned on when the first decoding signal DEC<1> is set to the logic high level. In addition, the transfer gate TG70 electrically couples the node nd51 and the ground voltage VSS. The transfer gate TG71 is turned on when the second decoding signal DEC<2> is set to the logic high level. Further, the transfer gate TG71 electrically couples the node nd70 and the ground voltage VSS. The transfer gate TG72 is turned on when the third decoding signal DEC<3> is set to the logic high level. Moreover, the transfer gate TG72 electrically couples the node nd71 and the ground voltage VSS. The second voltage control part 51 is configured to have a lowest resistance value when the first decoding signal DEC<1> is enabled to the logic high level. Further, the second voltage control part 51 is configured to have a highest resistance value when the third decoding signal DEC<3> is enabled to the logic high level.

Operations of the semiconductor system in accordance with an embodiment configured as mentioned above will be described below.

The offset signal generation circuit 106 included in the first semiconductor device 10 compares the internal temperature of the first semiconductor device 10 sensed from the first sensing codes TC1<1:N>, the second sensing codes TC2<1:N> and the third sensing codes TC3<1:N> and the internal temperature of the second semiconductor device 11 sensed from the temperature codes TCODE<1:N>. The offset signal generation circuit 106 also generates the first and second input offset signals OFFSET_IN<1:2>.

The temperature code generation circuit 113 included in the second semiconductor device 11 performs the temperature compensating operation by the first and second input offset signals OFFSET_IN<1:2>. The temperature code generation circuit 113 also generates the temperature code TCODE<1:N>. The reference voltage generation block 20 included in the temperature code generation circuit 113 controls the levels of the reference voltages VREF<1:N> according to the logic combination of the first and second input offset signals OFFSET_IN<1:2>. To this end, the signal conversion unit 30 converts the first and second input offset signals OFFSET_IN<1:2>. Further, signal conversation unit 30 also generates the first to third output offset signals OFFSET_OUT<1:3>. The decoder 311 decodes the first to third output offset signals OFFSET_OUT<1:3> and generates the first to third decoding signals DEC<1:3>. The voltage dividing section 312 controls the levels of the reference voltages VREF<1:N> according to the level combination of the first to third decoding signals DEC<1:3>. The operation in which the first to third output offset signals OFFSET_OUT<1:3> are generated in the signal conversion unit 30 will be described in detail with reference to FIG. 8. The operation of the decoder 311 will be described in detail with reference to FIG. 9. In addition, the operation of generating the temperature codes TCODE<1:N> will be described in detail with reference to FIGS. 10 and 11.

Figure 8:
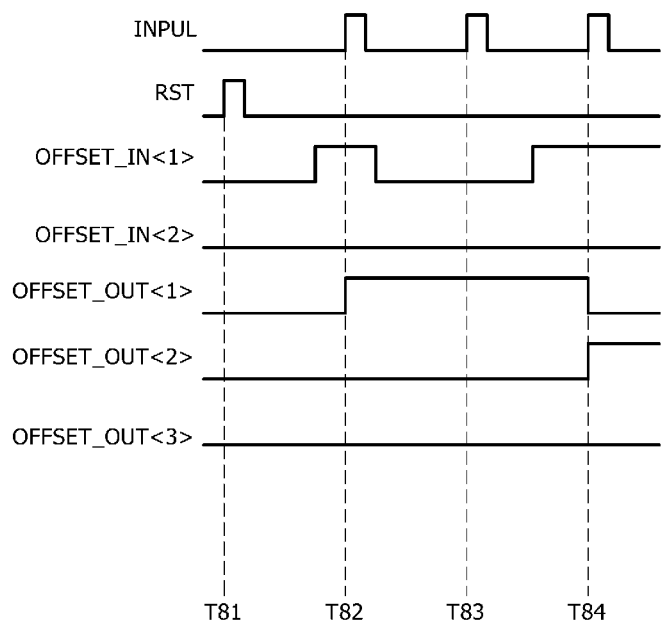

As shown in FIG. 8, if the reset signal RST is applied at time T81, the first to third output offset signals OFFSET_OUT<1:3> are initialized to the level combination of 'L,L,L.' Where a difference occurs between the internal temperatures of the first semiconductor device 10 and the second semiconductor device 11 and thus the first and second input offset signals OFFSET_IN<1:2> with the level combination of 'H,L' are inputted at time T82 in which a first input pulse INPUL is applied, the first to third output offset signals OFFSET_OUT<1:3> are increased by 1 bit to have the level combination of 'H,L,L.' Where no difference occurs between the internal temperatures of the first semiconductor device 10 and the second semiconductor device 11 and thus the first and second input offset signals OFFSET_IN<1:2> with the level combination of 'L,L' are inputted at time T83 in which a second input pulse INPUL is applied, the first to third output offset signals OFFSET_OUT<1:3> retain the level combination of 'H,L,L.' Where a difference occurs between the internal temperatures of the first semiconductor device 10 and the second semiconductor device 11 and thus the first and second input offset signals OFFSET_IN<1:2> with the level combination of 'H,L' are inputted at time T84 in which a third input pulse INPUL is applied, the first to third output offset signals OFFSET_OUT<1:3> are increased by 1 bit to have the level combination of 'L,H,L.'

Referring to FIG. 9, where the first to third output offset signals OFFSET_OUT<1:3> with the level combination of 'L,L,L' are inputted to the decoder 311, the decoder 311 generates the first decoding signal DEC<1> which is enabled to the logic high level. Where the first to third output offset signals OFFSET_OUT<1:3> with the level combination of 'L,L,H' are inputted to the decoder 311, the decoder 311 generates the second decoding signal DEC<2> which is enabled to the logic high level. In the case where the first to third output offset signals OFFSET_OUT<1:3> with the level combination of 'L,H,L' are inputted to the decoder 311, the decoder 311 generates the third decoding signal DEC<3> which is enabled to the logic high level.

Figure 10:
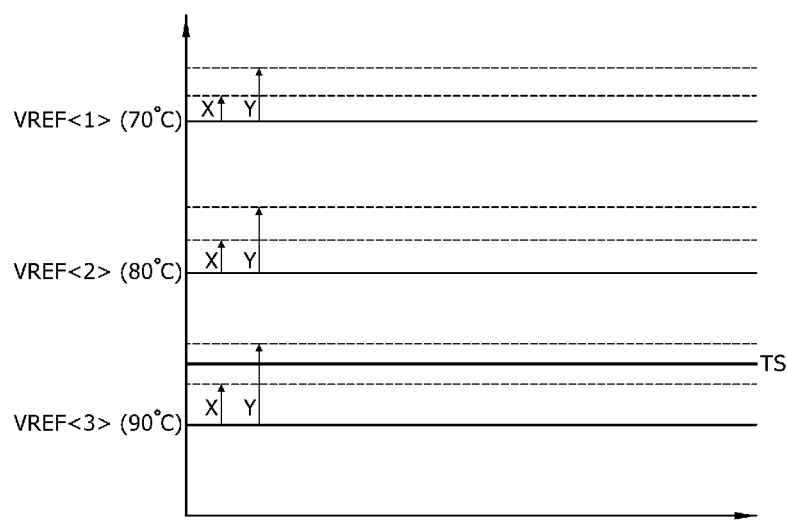

Referring to FIG. 10, the reference voltages VREF<1:3> of which levels are controlled where the first decoding signal DEC<1>, the second decoding signal DEC<2> and the third decoding signal DEC<3> are sequentially enabled may be checked. Vary temperatures of 70 to 90 is illustrated. More specifically, a level is increased by X in the case where the second decoding signal DEC<2> is enabled to the logic high level when compared to the case where the first decoding signal DEC<1> is enabled to the logic high level. In addition, a level is increased by Y where the third decoding signal DEC<3> is enabled to the logic high level when compared to the case where the first decoding signal DEC<1> is enabled to the logic high level. In the case where the third decoding signal DEC<3> is enabled to the logic high level, the level of the reference voltage VREF<3> corresponding to 90 becomes higher than the level of the temperature signal TS corresponding to the internal temperature of the second semiconductor device 11. Accordingly, as shown in FIG. 11, in the case where the third decoding signal DEC<3> is enabled to the logic high level, the temperature codes TCODE<1:3> are all generated to a logic high level. In the case where all the temperature codes TCODE<1:3> have the logic high level, it is meant that the internal temperature of the second semiconductor device 11 is sensed to be equal to or greater than 90.

As described above, in the semiconductor system in accordance with an embodiment, in the case where the internal temperature of the first semiconductor device 10 is equal to or greater than 90 even though the internal temperature of the second semiconductor device 11 is 80 to 90, because the first semiconductor device 10 and the second semiconductor device 11 are brought into contact with each other through the pads 101, 102, 111 and 112, the temperature codes TCODE<1:3> are generated such that the internal temperature of the second semiconductor device 11 is sensed to be equal to or greater than 90. To this end, the temperature code generation circuit 113 included in the second semiconductor device 11 is inputted with the first and second input offset signals OFFSET_IN<1:2> which are generated in the offset signal generation circuit 106. In addition, the temperature code generation circuit 113 controls the levels of the reference voltages VREF<1:N>. In other words, the sensed internal temperature of the second semiconductor device 11 is compensated for according to the internal temperature difference between the first semiconductor device 10 and the second semiconductor device 11 which are electrically coupled by the CoC (chip on chip) packaging technology. Since the operation of compensating for the internal temperature of the second semiconductor device 11 is performed using the first to third output offset signals OFFSET_OUT<1:3> converted from the first and second input offset signals OFFSET_IN<1:2>, the temperature compensating operation may be precisely performed.

Figure 12:
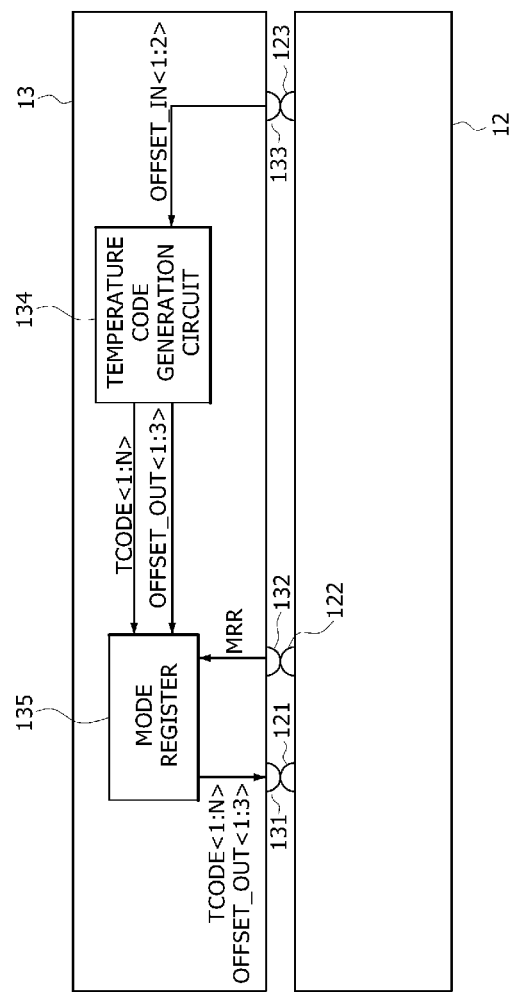
FIG. 12 is a block diagram illustrating a representation of an example of the configuration of a semiconductor system in accordance with an embodiment.

Referring to FIG. 12, a semiconductor system in accordance with an embodiment includes a first semiconductor device 12 and a second semiconductor device 13. The first semiconductor device 12 includes a first pad 121, a second pad 122, and a third pad 123. The second semiconductor device 13 includes a fourth pad 131, a fifth pad 132, a sixth pad 133, a temperature code generation circuit 134, and a mode register 135. The first pad 121 and the fourth pad 131 are electrically coupled and transfer temperature codes TCODE<1:N> and first to third output offset signals OFFSET_OUT<1:3> outputted from the mode register 135 from the second semiconductor device 13 to the first semiconductor device 12. The second pad 122 and the fifth pad 132 are electrically coupled and transfer a mode register read command MRR from the first semiconductor device 12 to the second semiconductor device 13. The third pad 123 and the sixth pad 133 are electrically coupled and transfer first and second input offset signals OFFSET_IN<1:2> generated in the first semiconductor device 12 to the second semiconductor device 13. Since the configurations and operations of the first semiconductor device 12 and the temperature code generation circuit 134 included in the second semiconductor device 13 are the same as those of the semiconductor system described above with reference to FIGS. 1 to 11, detailed descriptions thereof will be omitted.

The semiconductor system in accordance with the embodiment is distinguished from the semiconductor system shown in FIG. 1 in that the mode register 135 to store the temperature codes TCODE<1:N> and the first to third output offset signals OFFSET_OUT<1:3> generated in the temperature code generation circuit 134 is included. In the semiconductor system in accordance with the embodiment, the temperature codes TCODE<1:N> and the first to third output offset signals OFFSET_OUT<1:3> stored in the mode register 135 are transferred from the second semiconductor device 13 to the first semiconductor device 12 according to the mode register read command MRR. The first semiconductor device 12 may check in which scheme the sensed internal temperature of the second semiconductor device 13 is compensated for according to the internal temperature difference between the first semiconductor device 12 and the second semiconductor device 13 by checking the first to third output offset signals OFFSET_OUT<1:3>.

As is apparent from the above descriptions, according to the embodiment, by converting codes to allow offset signals to include an increased number of bits, temperature compensation according to an internal temperature difference between a controller and a semiconductor device may be precisely performed.

Also, according to the embodiment, since the offset signals which include the codes converted in the controller may be checked, it is possible to easily check in which range a temperature compensating operation is performed by the semiconductor device.

While various embodiments have been described above, it will be understood to those skilled in the art that the embodiments described are by way of example only. Accordingly, the semiconductor device and the semiconductor system including the same described herein should not be limited based on the described embodiments above.

What is claimed is:

1. A semiconductor system comprising:
   a first semiconductor device including an offset signal generation circuit configured to compare at least one sensing code and a temperature code and generate an input offset signal; and
   a second semiconductor device including a temperature code generation circuit configured to be inputted with the input offset signal, compare a reference voltage controlled according to the input offset signal and a temperature signal, and generate the temperature code, wherein the sensing code is generated by sensing an internal temperature of the first semiconductor device, and
   wherein the first semiconductor device further comprises:
   a first temperature sensor configured to sense a temperature in a first region and to generate a first sensing code; and
   a second temperature sensor configured to sense a temperature in a second region and to generate a second sensing code.

2. The semiconductor system according to claim 1, wherein the first semiconductor device comprises:
   a first pad through which the temperature code is inputted, and a second pad through which the input offset signal is outputted.

3. The semiconductor system according to claim 2, wherein the second semiconductor device comprises:
   a third pad through which the temperature code is outputted, and a fourth pad through which the input offset signal is inputted.

4. The semiconductor system according to claim 3, wherein the first pad and the third pad are electrically coupled, and the second pad and the fourth pad are electrically coupled.

5. The semiconductor system according to claim 1, wherein the offset signal generation circuit senses a temperature difference between an internal temperature of the first semiconductor device sensed by the sensing code and an internal temperature of the second semiconductor device sensed by the temperature code, and sets a level combination of the input offset signal.

6. The semiconductor system according to claim 1, wherein the temperature code generation circuit comprises:
   a reference voltage generation block configured to generate the reference voltage controlled according to a level combination of the input offset signal; and
   a comparison block configured to compare the reference voltage and the temperature signal of which level is set according to an internal temperature of the second semiconductor device, and generate the temperature code.

7. The semiconductor system according to claim 6, wherein the reference voltage retains a level when the input offset signal has a first level combination, and is changed in its level when the input offset signal has a second level combination.

8. The semiconductor system according to claim 6, wherein the reference voltage generation block comprises:
   a signal conversion unit configured to convert the input offset signal and generate an output offset signal; and
   a reference voltage output unit configured to output the reference voltage of which level is set according to the output offset signal.

9. The semiconductor system according to claim 8, wherein the output offset signal has a larger number of bits than the input offset signal, retains a level when the input offset signal has the first level combination, and is increased by 1 bit when the input offset signal has the second level combination.

10. The semiconductor system according to claim 8, wherein the output offset signal is transferred to the first semiconductor device.

11. The semiconductor system according to claim 8, wherein the reference voltage output unit comprises:
    a decoder configured to decode the output offset signal and to generate a decoding signal; and
    a voltage dividing section configured to perform a voltage dividing operation in response to the decoding signal and to set the level of the reference voltage.

12. The semiconductor system according to claim 11, wherein the voltage dividing section comprises:
    a first voltage control part electrically coupled between a power supply voltage and a first node, and having a first resistance value set by the decoding signal;
    a resistor part including a plurality of resistor elements electrically coupled between the first node and a second node, and configured to output the reference voltage; and a second voltage control part electrically coupled between the second node and a ground voltage, and having a second resistance value set by the decoding signal.

13. A semiconductor device comprising:
a reference voltage generation block configured to generate a reference voltage controlled according to a level combination of an input offset signal; and
a comparison block configured to compare the reference voltage and a temperature signal of which level is set according to an internal temperature of a semiconductor device, and to generate a temperature code,
wherein the input offset signal is generated as a controller electrically coupled with the semiconductor device through at least one pad compares at least one sensing code and the temperature code and the sensing code is generated by sensing an internal temperature, and
wherein the reference voltage generation block comprises:
a signal conversion unit configured to convert the input offset signal and to generate an output offset signal; and
a reference voltage output unit configured to output the reference voltage of which level is set according to the output offset signal.

14. The semiconductor device according to claim 13, wherein a level combination of the input offset signal is set according to a temperature difference between the internal temperature of the controller sensed by the sensing code and the internal temperature of the semiconductor device sensed by the temperature code.

15. The semiconductor device according to claim 13, wherein the reference voltage retains a level when the input offset signal has a first level combination, and is changed in its level when the input offset signal has a second level combination.

16. The semiconductor device according to claim 13, wherein the output offset signal has a larger number of bits than the input offset signal, retains a level when the input offset signal has the first level combination, and is increased by 1 bit when the input offset signal has the second level combination.

17. The semiconductor device according to claim 13, wherein the reference voltage output unit comprises:
a decoder configured to decode the output offset signal and to generate a decoding signal; and
a voltage dividing section configured to perform a voltage dividing operation in response to the decoding signal and to set the level of the reference voltage.

18. A semiconductor system comprising:
a first semiconductor device including a first temperature sensor configured to sense an internal temperature of a left region and to generate first sensing codes, a second temperature sensor configured to sense an internal temperature of a center region and to generate second sensing codes, and a third temperature sensor configured to sense an internal temperature of a right region and to generate third sensing codes; and
a second semiconductor device configured to control levels of reference voltages according to a logic combination of first and second input offset signals, to generate a temperature signal, to compare the levels of the reference voltages and the temperature signal, and to generate temperature codes.

* * * * *